(12) United States Patent
Wu et al.

(10) Patent No.: US 6,433,427 B1
(45) Date of Patent: Aug. 13, 2002

(54) WAFER LEVEL PACKAGE INCORPORATING DUAL STRESS BUFFER LAYERS FOR I/O REDISTRIBUTION AND METHOD FOR FABRICATION

(75) Inventors: Enboa Wu, Hsinchu; Tsung-Yao Chu, Taipei; Hsin-Chien Huang; Chung-Tao Chang, both of Hsinchu, all of (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 09/761,487

(22) Filed: Jan. 16, 2001

(51) Int. Cl.$^7$ .............................................. H01L 29/40
(52) U.S. Cl. ....................................... 257/737; 257/778
(58) Field of Search ................................ 257/750, 723, 257/737, 738, 778

(56) References Cited

U.S. PATENT DOCUMENTS 6,235,552 B1 * 5/2001 Kwon et al. ................. 438/106

* cited by examiner

Primary Examiner—Roy Potter
(74) Attorney, Agent, or Firm—Randy W. Tung (57) ABSTRACT

A wafer level package that incorporates dual stress buffer layers for achieving I/O pad redistribution and a method for forming the package are disclosed. In the package, a first stress buffer layer and a second stress buffer layer are sequentially deposited on top of an IC die by a method such as spin coating, laminating, screen printing or stencil printing of an elastic material which has a Young's modulus of less than 10 MPa. A suitable thickness for the first and the second stress buffer layer is between about 10 $\mu$m and about 70 $\mu$m. Metal traces are formed on top of the first and the second stress buffer layer for connecting a first plurality of I/O pads and a second plurality of I/O pads to achieve I/O redistribution.

20 Claims, 6 Drawing Sheets

WAFER LEVEL PACKAGE INCORPORATING DUAL STRESS BUFFER LAYERS FOR I/O REDISTRIBUTION AND METHOD FOR FABRICATION

FIELD OF THE INVENTION

The present invention generally relates to a wafer level package having a multiplicity of IC dies formed thereon and a method for fabrication and more particularly, relates to a wafer level package having a multiplicity of IC dies thereon each incorporating dual stress buffer layers for I/O redistribution and a method for such fabrication.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

Figure 1A:
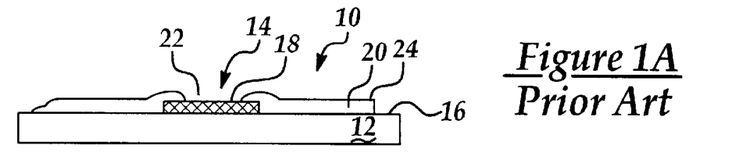
FIG. 1A is an enlarged, cross-sectional view of the conventional IC chip having a bond pad and an insulating material layer formed on top.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Figure 1B:
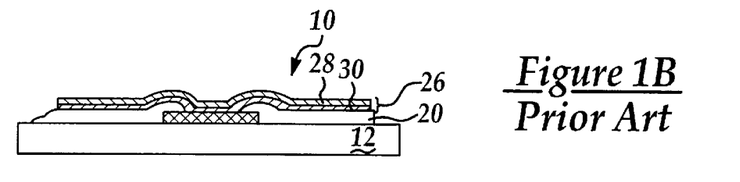
FIG. 1B is an enlarged, cross-sectional view of the conventional IC chip of FIG. 1A with UBM layers deposited on top.

Onto the top surface 24 of the passivation layer 20 and the exposed top surface 18 of the bond pad 14, is then deposited an under-bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

Figure 1C:
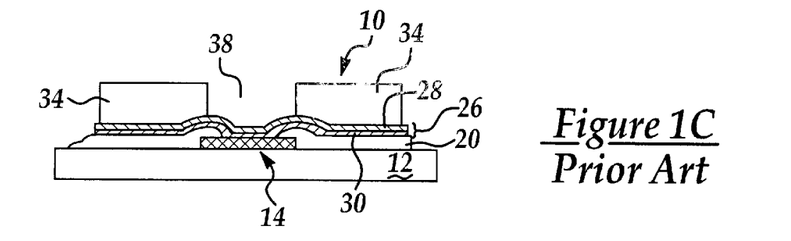
FIG. 1C is an enlarged, cross-sectional view of the conventional IC chip of FIG. 1B with a dielectric layer deposited and patterned on top.
Figure 1D:
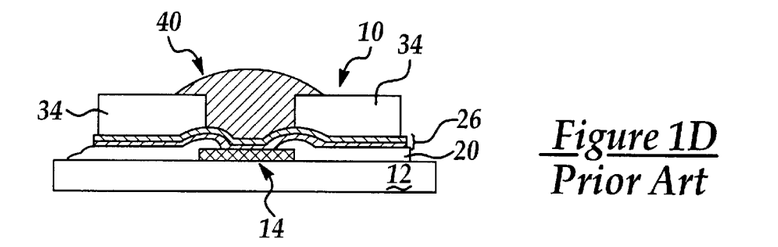
FIG. 1D is an enlarged, cross-sectional view of the conventional IC chip of FIG. 1C with solder paste deposited in an opening forming a solder bump.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 µm and about 40 µm, preferably at a thickness of about 35 µm. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Figure 1E:
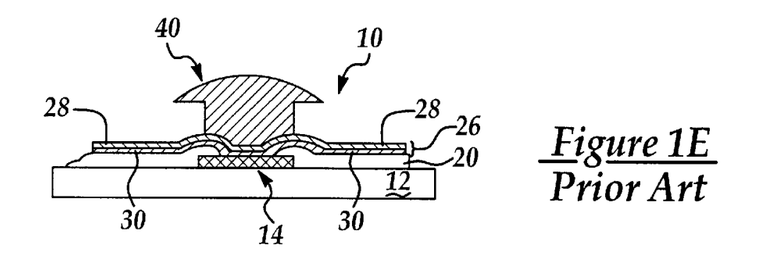
FIGS. 1E is an enlarged, cross-sectional view of the conventional IC chip of FIG. 1D with the dielectric mask layer removed.
Figure 1F:
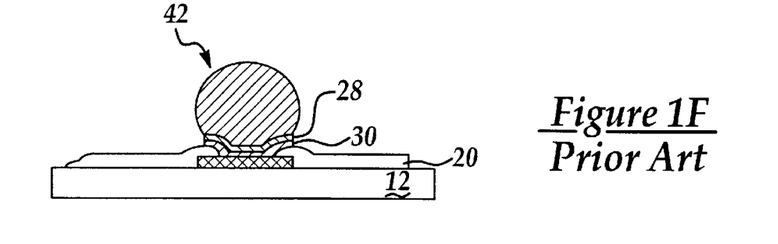
FIG. 1F is an enlarged, cross-sectional view of the conventional IC chip of FIG. 1E with the solder bump reflown into a solder ball.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 nm, is formed of a polymeric material such as polyimide which is laminated to a silicon elastomer layer of approximately 150 nm thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional flip-chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above presents a number of processing difficulties. For instance, in modern high-density semiconductor devices, the distance between I/O pads in a peripheral array continuously being reduced. In order to maintain a minimal required distance between the I/O pads, an I/O pad redistribution process must be conducted such that the pads can be transformed from a peripheral array to an area array. During the pad redistribution process, a plurality of metal traces must be formed to extend the I/O pads from the periphery of an IC die to the center of the IC die. It is desirable that, in order to assure the reliability of the die, a stress buffer layer is provided under the plurality of metal traces to buffer, or absorb, the stress incurred during the fabrication processes and to avoid stress cracking or fracture of the metal traces. The application of the stress buffering layers has been difficult in that if too thin a layer is applied, the stress buffering effect is insufficient to ensure the reliability of the IC die. However, when too thicker a layer of the stress buffering material is applied, numerous processing difficulties are incurred in the application process. Even though commercial stress buffering materials have been available in the marketplace, the fabrication technology for applying such materials to a satisfactory thickness has not been developed.

It is therefore an object of the present invention to provide a wafer level package that incorporates a stress buffer layer for I/O redistribution that does not have the drawbacks or shortcomings of the conventional wafer level packages.

It is another object of the present invention to provide a wafer level package that incorporates dual stress buffer layers for I/O redistribution that does not present any fabrication problems.

It is a further object of the present invention to provide a wafer level package that incorporates dual stress buffer layers for I/O redistribution wherein the layers are applied by a spin coating, a screen printing or a stencil printing technique.

It is another further object of the present invention to provide a wafer level package that incorporates dual stress buffer layers for I/O redistribution wherein a stress buffering material having a Young's modulus of less than 6 MPa is utilized.

It is still another object of the present invention to provide a wafer level package that incorporates dual stress buffer layers for I/O redistribution wherein two separate stress buffer layers are first formed prior to the formation of a plurality of metal traces on top of the stress buffer layers.

It is yet another object of the present invention to provide a wafer level package that incorporates dual stress buffer layers for I/O redistribution wherein a first stress buffer layer and a second stress buffer layer are sequentially deposited onto an IC die each to a thickness between about 10 $\mu$m and about 70 $\mu$m.

It is still another further object of the present invention to provide a method for forming a wafer level package which can be carried out by depositing a first stress buffer layer and a second stress buffer layer sequentially by a technique selected from spin coating, screen printing, laminating, and stencil printing.

It is yet another further object of the present invention to provide a method for forming a wafer level package by incorporating dual stress buffer layers for I/O pad redistribution by forming a plurality of metal traces on top of two separate layers of stress buffer materials each having a Young's modulus of less than 10 MPa.

SUMMARY OF THE INVENTION

In accordance with the present invention, a wafer level package incorporating dual stress buffer layers for I/O redistribution and a method for fabricating such wafer level package are disclosed.

In a preferred embodiment, a wafer level package that incorporates dual stress buffer layers for I/O redistribution is provided which includes a wafer that has a multiplicity of IC dies formed on an active surface; each of the multiplicity of IC dies further includes: a plurality of first I/O pads formed on a top surface insulated by a first dielectric layer deposited therein between; a plurality of interconnects formed on the plurality of I/O pads for providing electrical communication with the pads; a first stress buffer layer formed of an elastic material embedding the plurality of interconnects while exposing top surfaces of the plurality of interconnects; a second stress buffer layer formed of an elastic material on top of the first stress buffer layer without covering the exposed top surfaces of the plurality of interconnects; a plurality of metal traces formed on top of the first and second stress buffer layers each in electrical communication with one of the plurality of interconnects at a first end while a second end extends towards a center of the IC die; a second dielectric layer formed on top of the plurality of metal traces insulating the latter from each other while exposing a plurality of second I/O pads on each of the plurality of metal traces; and a plurality of solder balls formed on the plurality of second I/O pads arranged in an area array.

In the wafer level package that incorporates dual stress buffer layers for I/O redistribution, the first I/O pads are arranged in a periphery array and the second I/O pads are arrange in an area array. The first and second I/O pads are fabricated of a material that is selected from the group consisting of Cu, Al, Cu alloys and Al alloys. The first stress buffer layer may be formed of an elastic material that has a Young's modulus of less than 10 MPa, the second stress buffer layer may be formed of an elastic material similar to that used in forming the first stress buffer layer. The first stress buffer layer and the second stress buffer layer may be formed to a thickness between about 10 µm and about 70 µm, or preferably to a thickness between about 30 µm and about 50 µm. The package may further include a UBM (under-bump-metallurgy) layer in-between the plurality of solder balls and the plurality of second I/O pads. The second stress buffer layer may be formed of a single protruded layer on top of the first stress buffer layer, or formed of a plurality of protruded layers on top of the first stress buffer layer.

The present invention is further directed to a method for forming a wafer level package by incorporating dual stress buffer layers for I/O pad redistribution that can be carried out by the operating steps of first providing a wafer that has a multiplicity of IC dies formed on an active surface; forming a plurality of first I/O pads on the plurality of IC dies insulated by a first dielectric layer deposited therein between; forming a plurality of interconnects on the plurality of I/O pads in electrical communication with the pads; depositing a first stress buffer layer of a first elastic material embedding the plurality of interconnects while exposing a top surface of the plurality of interconnects; depositing a second stress buffer layer of a second elastic material on top of the first stress buffer layer without covering the exposed top surfaces of the plurality of interconnects; forming a plurality of metal traces on top of the first and second stress buffer layers each having a first end in electrical communication with one of the plurality of interconnects and a second end extending toward a center of the IC die; depositing a second dielectric layer on top of the plurality of metal traces insulating the latter from each other; exposing a plurality of second I/O pads each on one of the plurality of metal traces; and forming a plurality of solder balls on the plurality of second I/O pads.

The method for forming a wafer level package by incorporating dual stress buffer layers for I/O redistribution may further include the step of providing the first elastic material and the second elastic material in a material that has a Young's modulus of less than 10 MPa. The method may further include the step of depositing the first and the second stress buffer layer to a thickness between about 10 µm and about 70 µm; or preferably to a thickness between about 30 µm and about 50 µm. The method may further include the step of depositing a UBM layer on top of the plurality of second I/O pads prior to forming the plurality of solder balls on top. The method may further include the step of etching back a top surface of the first stress buffer layer to expose the top surfaces of the plurality of interconnects. The method may further include the step of exposing the plurality of second I/O pads arranged in an area array. The method may further include the step of depositing the second stress buffer layer in a plurality of islands of the second elastic material. The method may further include the step of exposing the plurality of second I/O pads by a photolithographic method. The method may further include the steps of exposing the plurality of second I/O pads by first depositing a plurality of photoresist studs on the plurality of second I/O pads, depositing the second dielectric layer on top and then removing the plurality of photoresist studs with the second dielectric layer on top exposing the plurality of second I/O pads.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer level package that incorporates dual stress buffer layers for I/O pad redistribution and a method for forming the wafer level package. The wafer level package of the present invention incorporates a first stress buffer layer and a second stress buffer layer formed of an elastic material that has a Young's Modulus of less than 10 MPa. The present invention wafer level package can be formed to redistribute I/O pads from a peripheral array to an area array.

The present invention further discloses a method for forming a wafer level package by incorporating two stress buffer layers for I/O pad distribution wherein the layers are deposited by spin coating, laminating, screen printing or stencil printing. The second stress buffer layer is formed on top of the first stress buffer layer either in a single protrusion or in a plurality of protrusions each formed in an island shape. In the method, the first and second stress buffer layers are deposited to a thickness between about 10 $\mu$m and about 70 $\mu$m, and preferably between about 30 $\mu$m and about 50 $\mu$m.

The present invention novel method is applicable to either an aluminum process or a copper process in forming wafer level packages. The present invention novel method overcomes the problems occurred in a conventional method by depositing a thick stress buffer layer in two separate steps. The present invention novel method further provides a standoff of larger dimension such that the reliability of the process can be improved. Furthermore, the present invention can be used to meet the requirements of electrical properties of a high frequency IC device in addition to overcoming the fabrication problems caused by the thick photoresist layers and the high aspect ratios. The present invention novel method further provides the benefit that existing bumping equipment can be used to reduce the fabrication costs.

Figure 2A:
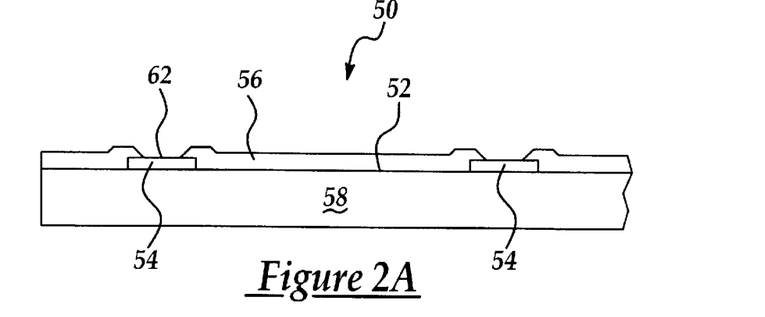
FIG. 2A is an enlarged, cross-sectional view of the present invention IC die with a plurality of I/O pads and an insulating layer formed on top.

Referring now to FIG. 2A, wherein a present invention IC die 50 with a plurality of a first I/O pads 54 formed on a top surface 52 of a silicon layer 58 is shown. The plurality of the first I/O pads 54 is insulated by a first dielectric layer 56 with the top surfaces 62 of the plurality of the first I/O pads 54 exposed. The plurality of the first I/O pads 54 may be advantageously fabricated in an electrically conductive metal such as aluminum or copper. The first dielectric layer 56 may be deposited on top of the IC die 50 and then patterned to expose the top surfaces 62 of the first I/O pads 54 by a standard photolithographic technique.

Figure 2B:
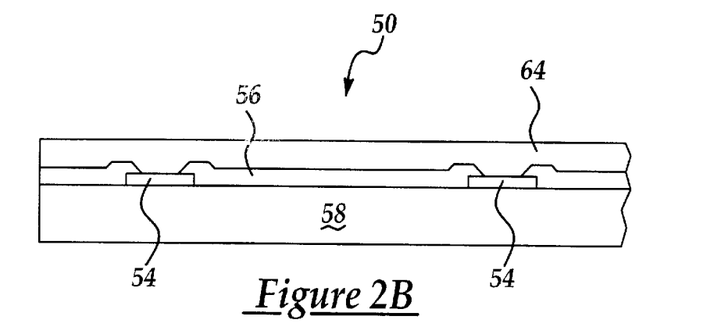
FIG. 2B is an enlarged, cross-sectional view of the present invention IC die of FIG. 2A with a photosensitive material layer formed on top.

An organic material layer 64, preferably of a photo sensitive material such as a photoresist material of polyimide is deposited on top of the IC die 50 to cover the first dielectric layer 56 and the plurality of the first I/O pads 54.

Figure 2C:
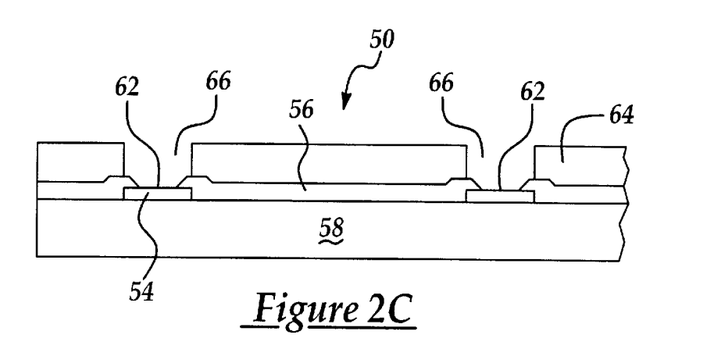
FIG. 2C is an enlarged, cross-sectional view of the present invention IC die of FIG. 2B with the photosensitive layer patterned to expose the plurality of I/O pads.

A suitable thickness of the organic material layer 64 may be between about 25 $\mu$m and about 100 $\mu$m, and preferably in the range between about 40 $\mu$m and about 60 $\mu$m. A thickness of about 50 $\mu$m was utilized in the preferred embodiment. The word "about" used in this writing indicates a range of values that is ±10% from the average value given. When the organic material layer 64 is formed by a photosensitive material, it can be advantageously patterned by a photolithographic method, such as that shown in FIG. 2C. The photosensitive material layer 64 is first patterned by a photolithographic process, and then etched by either a wet-etch or a dry-etch technique to form a plurality of openings 66 such that the top surfaces 62 of the plurality of the first I/O pads 54 are exposed.

It should be noted that, optionally, a thin metal seed layer (not shown) such as Ti may be sputter deposited on top of the structure shown in FIG. 2A. The metal seed layer is necessary when the plurality of interconnects 68 is formed by an electroplating technique. A suitable thickness of the metal seed layer may be between 500 Å and about 1500 Å, and preferably about 1000 Å. The metal seed layer may be formed by sputter or any other technique.

Figure 2D:
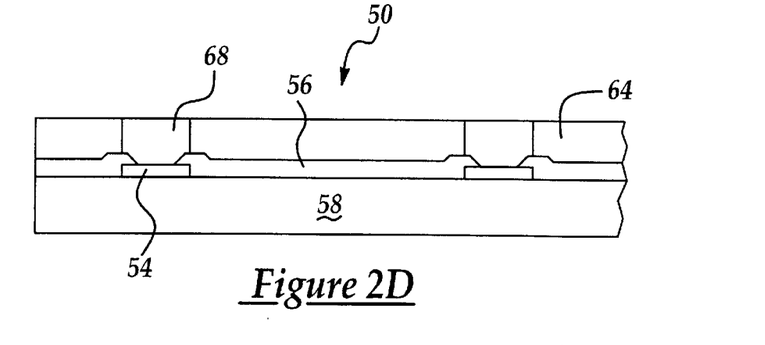
FIG. 2D is an enlarged, cross-sectional view of FIG. 2C with a plurality of metal studs electroplated on top of the plurality of I/O pads.
Figure 2E:
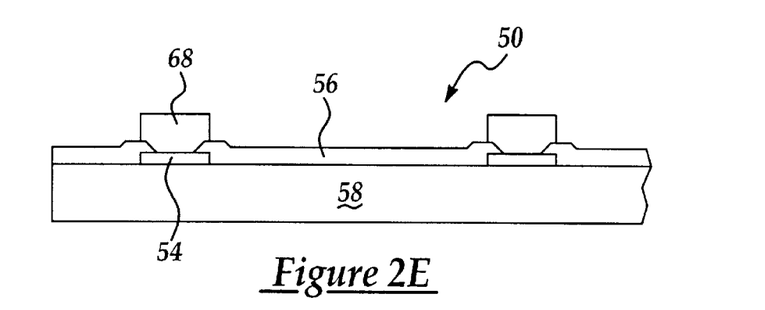
FIG. 2E is an enlarged, cross-sectional view of the present invention IC die of FIG. 2D with the photosensitive material layer removed.

In the next step of the process, as shown in FIG. 2D, the plurality of openings 66 is filled with an electrically conductive metal by an electroplating method to form a plurality of metal studs 68. The plurality of metal studs 68 provides electrical communication with the plurality of the first I/O pads 54 and can be advantageously formed of aluminum, copper, aluminum alloy or copper alloy. Other method for forming the plurality of metal studs 68 other than electroplating may further be used, for instance, by a technique of screen printing, stencil printing or electroless plating. After the plurality of metal studs 68 is formed and then a top surface is planarized, the organic material layer 64 can be removed by a suitable etching method. This is shown in FIG. 2E.

Figure 2F:
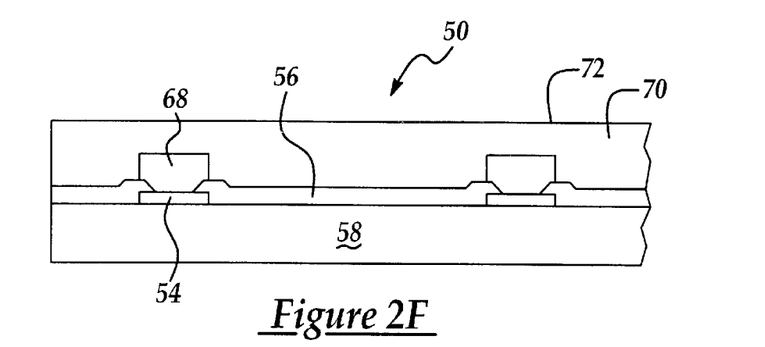
FIG. 2F is an enlarged, cross-sectional view of the present invention IC die of FIG. 2E with the first stress buffer layer deposited on top.
Figure 2G:
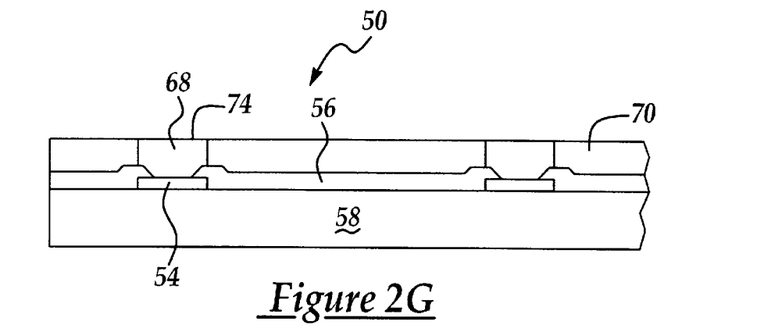
FIG. 2G is an enlarged, cross-sectional view of the present invention IC die of FIG. 2F with the first stress buffer layer etched back to expose the plurality of metal studs.

The present invention first stress buffer layer 70 can now be deposited onto the top of the IC die 50, as shown in FIG. 2F. The method for deposition includes spin coating, laminating, screen printing or stencil printing. A suitable thickness of the first stress buffer layer 70 deposited may be between about 10 $\mu$m and about 70 $\mu$m, and preferably between about 30 $\mu$m and about 70 $\mu$m. In a preferred embodiment, a thickness of about 60 $\mu$m for the first stress buffer layer is utilized. A suitable material for the first stress buffer layer may be an organic material that has an elasticity indicative by a Young's Modulus of less than 10 MPa, or preferably less than 6 Mpa. It was found that a suitable material for the first stress buffer layer 70 may be one that is supplied by Dow Corning as HIPEC™ Q1-4939, or HIPEC™ SDA-6501, or a material supplied by Shin Etsu SKJR-9050E. After the first stress buffer layer 70 is deposited onto the IC die 50 forming a top surface 72, as shown in FIG. 2G, an etch back process can be conducted to remove partially the stress layer material 70 such that the top surfaces of the plurality of metal studs 68 are exposed. The final thickness of the first stress buffer layer 70 is therefore controlled in the range between about 30 $\mu$m and about 50 $\mu$m.

Figure 2H:
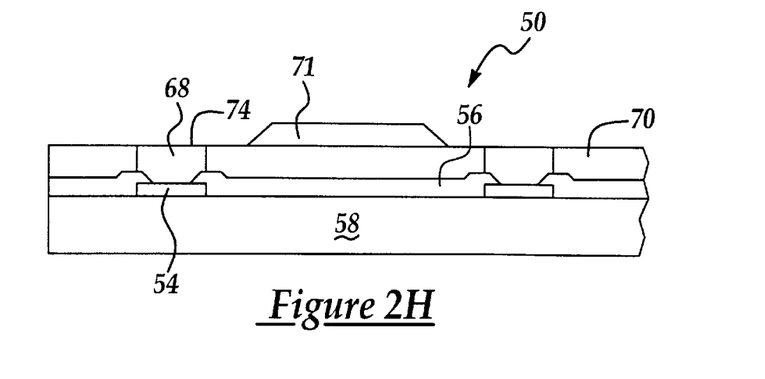
FIG. 2H is an enlarged, cross-sectional view of the present invention IC die of FIG. 2G with a second stress buffer layer deposited on top.

The present invention novel method further deposits a second stress buffer layer 71 on top of the first stress buffer layer 70 to a thickness that is similar to the thickness for the first stress buffer layer 70, i.e. in the range between about 30 and about 50 $\mu$m. The second stress buffer layer 71 is deposited in a shape of a protrusion on top of the first stress buffer layer 70 by a material that is substantially the same as that used in depositing the first stress buffer layer 70. As will be shown in a latter step, the location of the second stress buffer layer 71 determines the location for the formation of the second I/O pads.

Figure 2I:
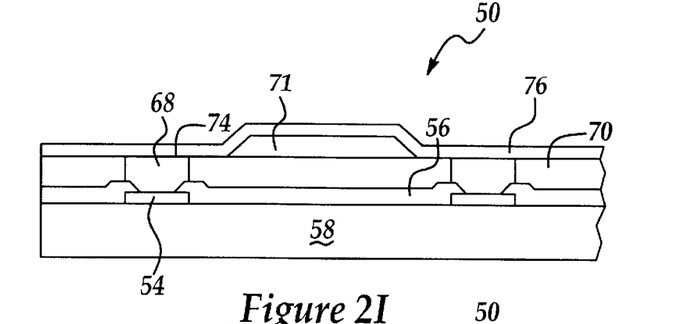
FIG. 2I is an enlarged, cross-sectional view of the present invention IC die of FIG. 2H with a metal trace layer deposited on top.

In the next step of the present invention novel method, as shown in FIG. 2I, the I/O pad redistribution for the IC die 50 is accomplished. The I/O pad redistribution is accomplished by a photolithographic method such that the plurality of the first I/O pads 54 situated along the periphery of the IC die 50 can be extended to a center region of the die, i.e. transforming from a peripheral array I/O pad to an area array I/O pad through the redistribution process. The redistribution process is accomplished on top of two stress buffer layers such that the reliability of the final fabricated device can be greatly improved. The redistribution process can be accomplished by first depositing a metal trace layer 76 on top of the first stress buffer layer 70, the plurality of metal studs 68 and the second stress buffer layer 71. The deposition of the metal trace layer 76 can be carried out by a sputtering technique using a high conductivity metal such as aluminum or copper. This is shown in FIG. 2I.

Figure 2J:
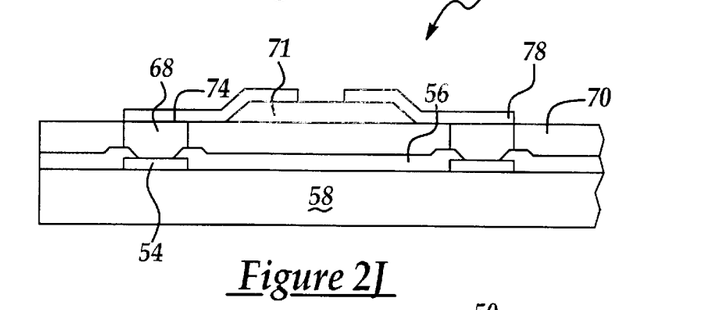
FIG. 2J is an enlarged, cross-sectional view of the present invention IC die of FIG. 2I with the metal trace layer patterned for I/O pad redistribution.

In the next step of the process, a photolithography method is used to define the metal trace layer 76, as shown in FIG. 2J to form the plurality of metal traces 78. It is to be noted that each of the metal traces 78 connects only to one of the plurality of metal studs 68 at the periphery of the IC die 50 with an opposite end of the metal traces 78 extending toward a center of the IC die 50 on top of the second stress buffer layer 71, i.e. transforming I/O pads from a peripheral array to an area array.

Figure 2K:
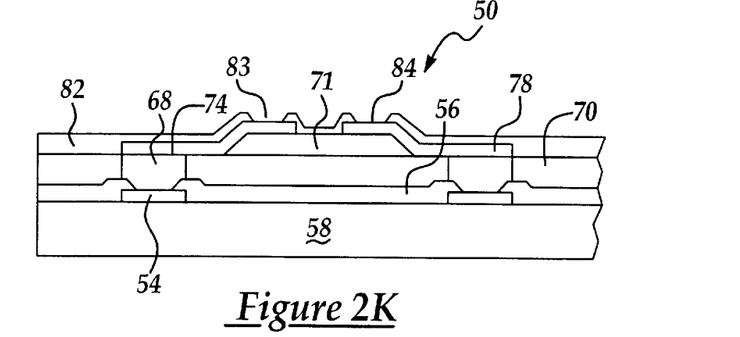
FIG. 2K is an enlarged, cross-sectional view of the present invention IC die of FIG. 2J with a dielectric layer deposited on top of and insulating the metal trace layer.

After the formation of the plurality of metal traces 78, a passivation layer 82 is first deposited on top of the metal traces 78 and then patterned to expose areas of the metal traces 78 at locations for the second I/O pads. A suitable material for depositing the passivation 82 may be an elastomeric material or a material such as polyimide or BCB. The passivation layer 82 is first blanket deposited and then patterned to form openings 83 for the second I/O pads 84. One of the methods for forming the second I/O pads 84 is to first deposit a layer of a photoresist stud at the I/O pad opening 83, then depositing on top a passivation layer 82, followed by a process for removing part of the passivation layer 82 that is on top of the photoresist stud and the photoresist stud together. Another method for forming the second I/O pads 84 is to first deposit the passivation layer 82, then utilizing a photolithographic method to expose the second I/O pads 84. Still further, the I/O pads 84 can be formed by directly removing the passivation material layer 82 by a laser means to define openings 83.

Figure 2L:
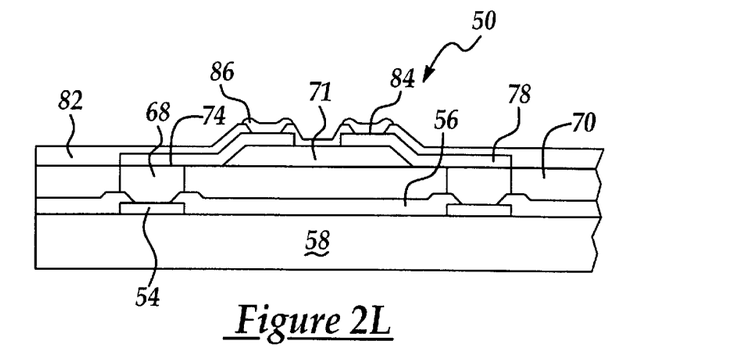
FIG. 2L is an enlarged, cross-sectional view of the present invention IC die of FIG. 2K with under-bump-metallurgy layers formed on the second I/O pads.
Figure 2M:
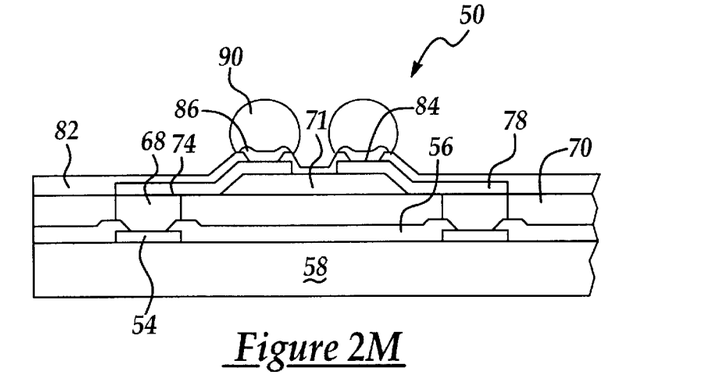
FIG. 2M is an enlarged, cross-sectional view of the present invention IC die of FIG. 2L with solder balls formed on the second I/O pads.

In the final steps of the process, as shown in FIGS. 2L and 2M, a under-bump-metallurgy layer 86 is first deposited on top of the passivation layer 82 and then defined into UBM layers 86 which only covers the second I/O pads 84. The UBM layer 86 may be advantageously deposited by an electroplating method or by other suitable deposition techniques. After the formation of the UBM layers 86, an electrodeposition technique or other suitable techniques is used to form a solder bump (not shown) on top of the UBM layers 86. After a reflow process is conducted on the solder bumps, the bumps are formed into solder balls 90, as shown in FIG. 2M. A wafer level package formed of a multiplicity of IC dies 50 on a single silicon wafer is thus completed and ready for singulation of the individual IC packages.

Figure 3A:
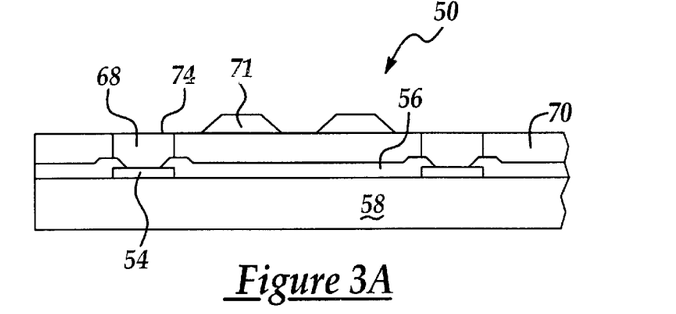
FIG. 3A is an enlarged, cross-sectional view of a second preferred embodiment of the present invention IC die wherein the second stress buffer layer is deposited in a plurality of islands.
Figure 3B:
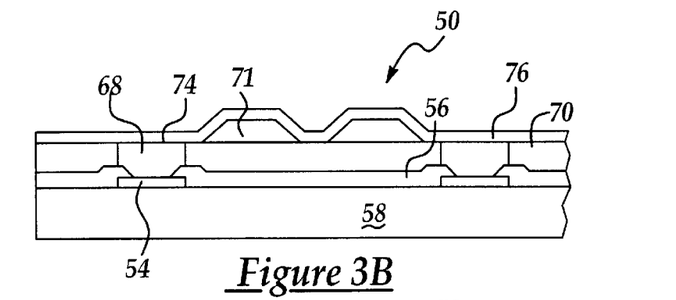
FIG. 3B is an enlarged, cross-sectional view of the present invention IC die of FIG. 3A having a metal trace layer deposited on top.
Figure 3C:
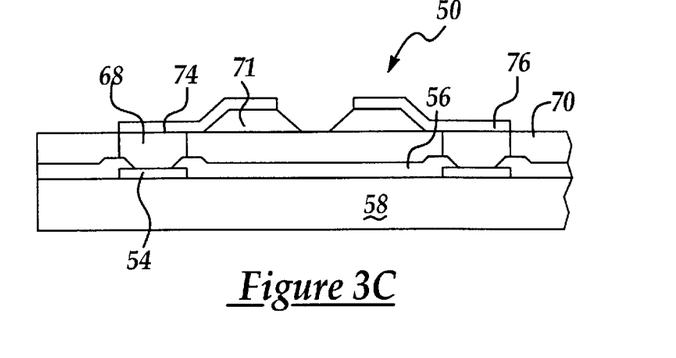
FIG. 3C is an enlarged, cross-sectional view of the present invention IC die of FIG. 3B with the metal trace layer patterned.
Figure 3D:
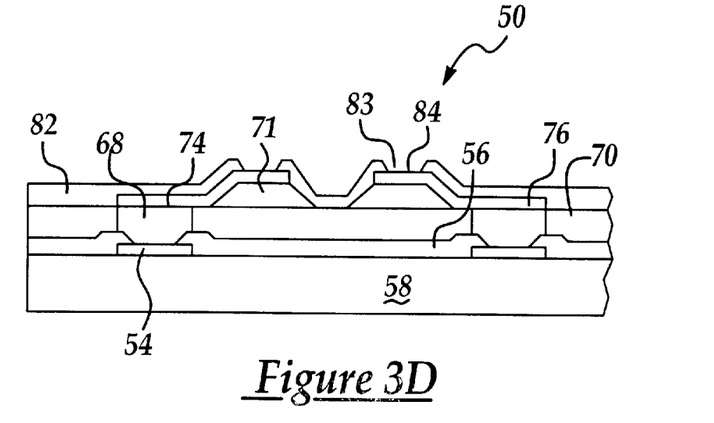
FIG. 3D is an enlarged, cross-sectional view of the present invention IC die of FIG. 3C with a dielectric insulating layer deposited and patterned on top exposing a plurality of second I/O pads.
Figure 3E:
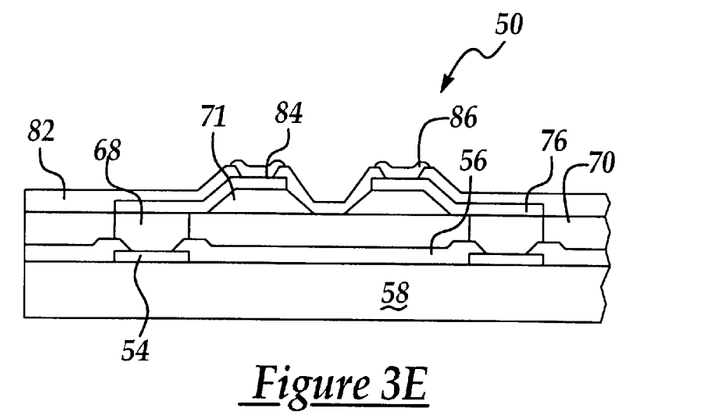
FIG. 3E is an enlarged, cross-sectional view of the present invention IC die of FIG. 3D with under-bump-metallurgy layers deposited on top of the plurality of second I/O pads.
Figure 3F:
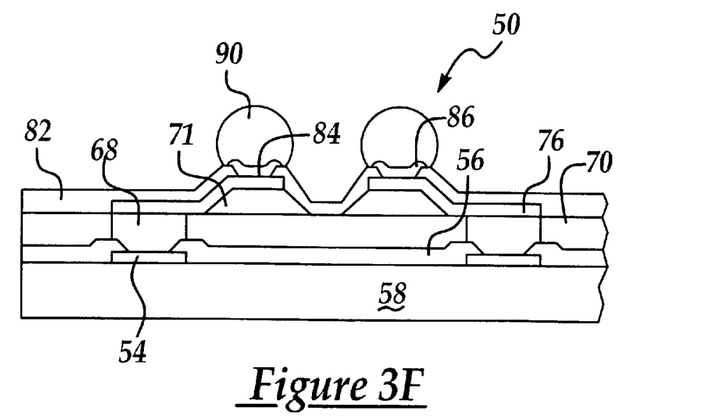
FIG. 3F is an enlarged, cross-sectional view of FIG. 3E with a plurality of solder balls formed on the plurality of second I/O pads arranged in an area array.

In a second preferred embodiment, shown in FIGS. 3A–3E, a plurality of the second stress buffer layer 71 is formed, instead of a single protruded layer shown in the first preferred embodiment. This is shown in FIG. 3A. The plurality of the second stress buffer layer 71 may be advantageously formed in the shape of islands on top of the first stress buffer layer 70. Processing steps similar to that used in the first preferred embodiment, i.e. the metal trace deposition, the metal trace patterning, the formation of the passivation layer, the patterning of the second I/O pads, the deposition of the UBM layer, and the final formation of the solder balls are used. This is shown in FIGS. 3B–3F.

The present invention novel method achieves I/O pad redistribution from a peripheral array to an area array on top of an IC die formed on a silicon wafer. The first stress buffer layer and the second stress buffer layer are advantageously used under a metal trace layer to absorb stresses incurred during the various fabrication steps. A highly reliable chip package can thus be fabricated which eliminates most fabrication problems caused by stress.

The present invention novel device formed with two separate stress buffer layers can further absorb stress incurred due to a mismatch between the coefficients of thermal expansion of the various materials deposited on top of the IC die. The stress caused by the contraction or expansion of the various materials can be absorbed by the dual layers of the stress buffer material which has sufficient elasticity.

The present invention novel method for applying two separate layers of stress buffer materials further provides the benefit that the first stress buffer layer does not need to be deposited to a large thickness, contrary to a conventional process wherein a single stress buffer layer is deposited. Since the thickness of the stress buffer layer is related to the step for forming the metal studs on the first I/O pads, a thick stress buffer layer necessarily requires a thick photoresist layer to be used which directly affects the photolithographic process causing poor resolution and large aspect ratio problem. The present invention novel method solves such problems by providing two separate layers of the stress buffer material such that the first stress buffer layer need not be deposited to a large thickness.

Furthermore, the present invention novel method utilizes a mechanical method such as spin coating, screen printing or stencil printing for applying the first and the second stress buffer layers. A more reliable and simplified manufacturing process is thus achieved. Furthermore, the two separate layers of the stress buffer material provide a larger standoff such that the reliability of the package can be improved. Another added advantage made possible by the present invention novel method is that electrical characteristics necessary for high frequency devices can be satisfied such that, the present invention novel package may be used for packaging high frequency elements such as Rambus DRAM devices.

The present invention novel wafer level package that incorporates dual stress buffer layers for achieving I/O pad redistribution and a method for fabricating such package has therefore been amply described in the above description and in the appended drawings of FIGS. 2A–3F.

While the present invention has been described in an illustrative manner, it should be understood that the terminology used is intended to be in a nature of words of description rather than of limitation.

Furthermore, while the present invention has been described in terms of two preferred embodiments, it is to be appreciated that those skilled in the art will readily apply these teachings to other possible variations of the inventions.

The embodiment of the invention in which an exclusive property or privilege is claimed are defined as follows.

What is claimed is:

1. A wafer level package incorporating dual stress buffer layers for I/O redistribution comprising:
   a wafer having a multiplicity of IC dies formed on an active surface; each of said multiplicity of IC dies further comprises:

a plurality of first I/O pads formed on a top surface insulated by a first dielectric layer deposited therein-between;

a plurality of interconnects formed on said plurality of I/O pads for providing electrical communication with said pads;

a first stress buffer layer formed of an elastic material embedding said plurality of interconnects while exposing a top surface of said plurality of interconnects;

a second stress buffer layer formed of an elastic material on top of said first stress buffer layer without covering said exposed top surfaces of said plurality of interconnects;

a plurality of metal traces formed on top of said first and second stress buffer layers each in electrical communication with one of said plurality of interconnects at a first end while a second end extends toward a center of said IC die;

a second dielectric layer formed on top of said plurality of metal traces insulating the latter from each other while exposing a plurality of second I/O pads on each of said plurality of metal traces; and a plurality of solder balls formed on said plurality of second I/O pads arranged in an area array.

2. A wafer level package incorporating dual stress buffer layers for I/O redistribution according to claim 1, wherein said first I/O pads are arranged in a periphery array and said second I/O pads are arranged in an area array.

3. A wafer level package incorporating dual stress buffer layers for I/O redistribution according to claim 1, wherein said first and second I/O pads are fabricated of a material selected from the group consisting of Cu, Al, Cu alloys and Al alloys.

4. A wafer level package incorporating dual stress buffer layers for I/O redistribution according to claim 1, wherein said first stress buffer layer being formed of an elastic material with a Young's modulus of less than 10 MPa.

5. A wafer level package incorporating dual stress buffer layers for I/O redistribution according to claim 1, wherein said second stress buffer layer being formed of an elastic material with a Young's modulus of less than 10 MPa.

6. A wafer level package incorporating dual stress buffer layers for I/O redistribution according to claim 1, wherein said first stress buffer layer and said second stress buffer layer being formed to a thickness between about 10 μm and about 70 μm.

7. A wafer level package incorporating dual stress buffer layers for I/O redistribution according to claim 1, wherein said first stress buffer layer and said second stress buffer layer being formed preferably to a thickness between about 30 μm and about 50 μm.

8. A wafer level package incorporating dual stress buffer layers for I/O redistribution according to claim 1 further comprising a under-bump-metallurgy layer in-between said plurality of solder balls and said plurality of second I/O pads.

9. A wafer level package incorporating dual stress buffer layers for I/O redistribution according to claim 1, wherein said second stress buffer layer being formed of a single protruded layer on top of said first stress buffer layer.

10. A wafer level package incorporating dual stress buffer layers for I/O redistribution according to claim 1, wherein said second stress buffer layer being formed of a plurality of protruded layers on top of said first stress buffer layer.

11. A wafer level package incorporating dual stress buffer layers for I/O redistribution comprising:

a wafer having a multiplicity of IC dies formed on an active surface; each of said multiplicity of IC dies further comprises:

a plurality of first I/O pads arranged in a periphery array formed on a top surface insulated by a first dielectric layer deposited therein-between;

a plurality of interconnects formed on said plurality of I/O pads for providing electrical communication with said pads;

a first stress buffer layer formed of an elastic material embedding said plurality of interconnects while exposing a top surface of said plurality of interconnects;

a second stress buffer layer formed of an elastic material on top of said first stress buffer layer without covering said exposed top surfaces of said plurality of interconnects;

a plurality of metal traces formed on top of said first and second stress buffer layers each in electrical communication with one of said plurality of interconnects at a first end while a second end extends toward a center of said IC die;

a second dielectric layer formed on top of said plurality of metal traces insulating the latter from each other while exposing a plurality of second I/O pads arranged in an area array on each of said plurality of metal traces; and a plurality of solder balls formed on said plurality of second I/O pads.

12. A wafer level package incorporating dual stress buffer layers for I/O redistribution according to claim 11, wherein said plurality of first and second I/O pads are fabricated of a material selected from the group consisting of Cu, Al, Cu alloys and Al alloys.

13. A wafer level package incorporating dual stress buffer layers for I/O redistribution according to claim 11, wherein said first stress buffer layer being formed of an elastic material with a Young's modulus of less than 10 MPa.

14. A wafer level package incorporating dual stress buffer layers for I/O redistribution according to claim 11, wherein said second stress buffer layer being formed of an elastic material with a Young's modulus of less than 10 MPa.

15. A wafer level package incorporating dual stress buffer layers for I/O redistribution according to claim 11, wherein said first stress buffer layer and said second stress buffer layer being formed to a thickness between about 10 μm and about 70 μm.

16. A wafer level package incorporating dual stress buffer layers for I/O redistribution according to claim 11, wherein said first stress buffer layer and said second stress buffer layer being formed preferably to a thickness between about 30 μm and about 50 μm.

17. A wafer level package incorporating dual stress buffer layers for I/O redistribution according to claim 11 further comprising a under-bump-metallurgy layer in-between said plurality of solder balls and said plurality of second I/O pads.

18. A wafer level package incorporating dual stress buffer layers for I/O redistribution according to claim 11, wherein said second stress buffer layer being formed of a single protruded layer on top of said first stress buffer layer.

19. A wafer level package incorporating dual stress buffer layers for I/O redistribution according to claim 11, wherein said second stress buffer layer being formed of a plurality of protruded layers on top of said first stress buffer layer.

20. A wafer level package incorporating dual stress buffer layers for I/O redistribution comprising:

a wafer having a multiplicity of IC dies formed on an active surface; each of said multiplicity of IC dies further comprises:

a plurality of first I/O pads formed on a top surface insulated by a first dielectric layer deposited therein-between;

a plurality of interconnects formed on said plurality of I/O pads for providing electrical communication with said pads;

a first stress buffer layer formed of an elastic material embedding said plurality of interconnects while exposing a top surface of said plurality of interconnects;

a second stress buffer layer formed of an elastic material on top of said first stress buffer layer without covering said exposed top surfaces of said plurality of interconnects, said second stress buffer layer being formed of a single protruded layer;

a plurality of metal traces formed on top of said first and second stress buffer layers each in electrical communication with one of said plurality of interconnects at a first end while a second end extends toward a center of said IC die;

a second dielectric layer formed on top of said plurality of metal traces insulating the latter from each other while exposing a plurality of second I/O pads on each of said plurality of metal traces; and a plurality of solder balls formed on said plurality of second I/O pads arranged in an area array.

* * * * *